(12) United States Patent
Chen et al.

(10) Patent No.: US 9,329,228 B2
(45) Date of Patent: May 3, 2016

(54) PROGNOSTIC CIRCUIT OF ELECTROMIGRATION FAILURE FOR INTEGRATED CIRCUIT

(71) Applicant: Fifth Electronics Research Institute of Ministry of Industry and Information Technology, Guangdong (CN)

(72) Inventors: Yiqiang Chen, Guangdong (CN); Yunfei En, Guangdong (CN); Yun Huang, Guangdong (CN); Yudong Lu, Guangdong (CN); Qingzhong Xiao, Guangdong (CN)

(73) Assignee: FIFTH ELECTRONICS RESEARCH INSTITUTE OF MINISTRY OF INDUSTRY AND INFORMATION TECHONOLY, Guangdong (CN)

( * ) Notice: Subject to any disclaimer, the term of this patent is extended or adjusted under 35 U.S.C. 154(b) by 41 days.

(21) Appl. No.: 14/348,849

(22) PCT Filed: Jun. 8, 2013

(86) PCT No.: PCT/CN2013/077012
§ 371 (c)(1),
(2) Date: Mar. 31, 2014

(87) PCT Pub. No.: WO2014/094413
PCT Pub. Date: Jun. 26, 2014

(65) Prior Publication Data
US 2014/0232428 A1 Aug. 21, 2014

(30) Foreign Application Priority Data
Dec. 20, 2012 (CN) .......................... 2012 1 0560083

(51) Int. Cl.
*G01R 31/02* (2006.01)
*G01R 31/28* (2006.01)
*G01R 31/30* (2006.01)

(52) U.S. Cl.
CPC ........ *G01R 31/2853* (2013.01); *G01R 31/2856* (2013.01); *G01R 31/30* (2013.01)

(58) Field of Classification Search
None
See application file for complete search history.

(56) References Cited

U.S. PATENT DOCUMENTS

| 5,777,486 A | 7/1998 | Hsu |
| 6,091,080 A * | 7/2000 | Usui .................. H01L 23/5223 257/48 |

(Continued)

FOREIGN PATENT DOCUMENTS

| CN | 101364573 A | 2/2009 |
| CN | 101364573 A | 2/2009 |

(Continued)

OTHER PUBLICATIONS

International Search Report for related International Application No. PCT/CN2013/077012; report dated Dec. 20, 2012.

(Continued)

*Primary Examiner* — Minh N Tang
(74) *Attorney, Agent, or Firm* — Miller, Matthias & Hull LLP

(57) ABSTRACT

A prognostic circuit of EM failure for IC is disclosed, which includes a current monitoring module, the current monitoring module includes a current output module electrically connected with a monitoring metal wire, and one or more conductive metals covered by an oxide layer and electrically insulated with the monitoring metal wire, the current output module includes at least one current source, the conductive metal is electrically connected with the output port of the current monitoring module, and the monitoring metal wire is surrounded by the conductive metal. The above prognostic circuit can give a warning for short-circuit failure caused by a whisker created by EM. Meanwhile, the prognostic circuit of the present disclosure can also be added a resistance warning, and it can indicate the failure of the resistance increased by EM and the short circuit caused by whisker, so as to greatly increase the warning efficiency of the EM.

9 Claims, 13 Drawing Sheets

(56) References Cited

U.S. PATENT DOCUMENTS

| | | | |
|---|---|---|---|
| 6,147,361 A * | 11/2000 | Lin | G01R 31/2858 257/48 |
| 6,570,181 B1 | 5/2003 | Graas et al. | |
| 6,897,476 B1 * | 5/2005 | Kim | G01K 7/00 257/48 |
| 7,119,545 B2 | 10/2006 | Ahsan et al. | |
| 2006/0066335 A1 | 3/2006 | Kang et al. | |
| 2007/0164768 A1 * | 7/2007 | Hsu | G01R 31/2858 324/750.3 |
| 2008/0128693 A1 | 6/2008 | Shi et al. | |

FOREIGN PATENT DOCUMENTS

| | | |
|---|---|---|
| CN | 102044526 A | 5/2011 |
| CN | 102339815 A | 2/2012 |
| CN | 102339815 A | 2/2012 |
| CN | 102386167 A | 3/2012 |
| CN | 102590629 A | 7/2012 |
| CN | 102590629 A | 7/2012 |
| CN | 102760727 A | 10/2012 |
| CN | 103033740 A | 4/2013 |
| CN | 103033740 A | 4/2013 |
| CN | 103809062 A | 5/2014 |
| TW | 200506393 | 2/2005 |

OTHER PUBLICATIONS

Search Report and first Office Action for Priority Chinese Application No. 201210560083.0 mailed on Aug. 26, 2014.

Second Office Action for Priority Chinese Application No. 201210560083.0 mailed on Apr. 27, 2015.

International Search Report and Written Opinion for related International Application No. CN2013/077012 mailed Sep. 26, 2013.

* cited by examiner

PROGNOSTIC CIRCUIT OF ELECTROMIGRATION FAILURE FOR INTEGRATED CIRCUIT

CROSS-REFERENCE TO RELATED APPLICATIONS

This application is a 35 USC §371 U.S. national stage filing of International Patent Application No. PCT/CN2013/077012 filed on Jun. 8, 2013, and claiming priority under the Paris Convention to Chinese Patent Application No. CN 201210560083.0 filed on Dec. 20, 2012.

TECHNICAL FIELD

The present disclosure relates to integrated circuit technology, and more particularly, to a prognostic circuit of electromigration (EM) failure for integrated circuit (IC).

BACKGROUND

With the IC composed by Metal Oxide Semiconductor (MOS) devices widely used in many fields, the reliability problem caused by the degradation of electrical properties in production and application process is becoming increasingly prominent. The progress and updating of microelectronics technology are marked by the reduction in feature size of IC and the increase of integration. With the rapid development of microelectronics technology, the feature size of IC decreases to nanometer, and the area percent of metal interconnects becomes larger and larger in the whole chip. The problem of EM failure in metal interconnect has become bottleneck for the development of large-scale IC, which has become the focus of the research for reliability of IC. The EM is caused by the migration of ions in metal under the action of current distribution, and is the transport of material caused by the movement of electrons acting on metal atoms in the metal interconnect, which is shown as increase in resistance value and with the increasing of the resistance to a certain extent causes metal film local loss to create an cavity or causes metal film local accumulation to create a hillock or whisker, resulting in saltation and failure that severely affect the life of the IC. The main behaviors of IC failure caused by EM are: (1) creating a cavity in metal interconnect to increase the resistance; (2) the cavity growing and passing through the interconnect wire to create an open circuit; (3) creating a whisker in metal interconnect to cause a layer short circuit; and (4) the whisker growing and passing through the passivation layer to cause a etching source.

A prognostic circuit had been designed in the prior art based on the EM failure mechanism of IC, which outputs a prognostic signal when the resistance increases to a specified threshold, so as to avoid the critical failure of the system caused by EM failure. However, in a practical application, both the increased resistance caused by EM and the short circuit caused by whiskers may occur. The above solution only indicates the increased resistance failure that is caused by EM, and not a circuit which indicates the short circuit failure that is caused by EM.

SUMMARY

In view of the above, it is necessary to provide a prognostic circuit for EM failure of IC, which is required to solve the problem that there is no circuit for indicating the failure that is caused by the short circuit caused by EM in the prior art.

According to one aspect, the object of the disclosure is to provide a prognostic circuit for EM failure of IC, including a current monitoring module, the current monitoring module includes a current output module electrically connected with a monitoring metal wire, and one or more conductive metals covered by an oxide layer and electrically insulated with the monitoring metal wire, the current output module includes at least one current source, the conductive metal is electrically connected with the output port of the current monitoring module, and the monitoring metal wire is surrounded by the conductive metal.

Preferably, the conductive metal includes a first metal provided on the top of the monitoring metal wire, a second metal provided on the bottom of the monitoring metal wire, and third metals respectively provided on the two sides of the monitoring metal wire, and the first metal, the second metal and the third metals are electrically interconnected by a plurality of through-hole metals passing through a oxide layer.

Preferably, the second metal is directly below and parallel to the monitoring metal wire, and the second metal is electrically insulated with the monitoring metal wire by an oxide layer; the third metals are located on the two sides of the monitoring metal wire, which are parallel to each other, and the third metals are electrically insulated with the monitoring metal wire by an oxide layer; the first metal is directly above and parallel to the monitoring metal wire, and the first metal is electrically insulated with the monitoring metal wire by an oxide layer; and the plurality of through-hole metals include a first through-hole metal and a second through-hole metal, the third metal is electrically connected with the second metal by the first through-hole metal, and the third metal is electrically connected with the first metal by the second through-hole metal.

Preferably, the prognostic circuit of EM also includes a resistance monitoring module connected with the monitoring metal wire, and the resistance monitoring module is configured to transfer the resistance variation of the monitoring metal wire to voltage variation and output.

Preferably, the resistance monitoring module includes a comparison metal wire, the current output module is connected with a first end of the monitoring metal wire, and a second end of the monitoring metal wire is in series with the comparison metal wire to form a monitoring series circuit.

Preferably, the resistance of the comparison metal wire is the same as that of the monitoring metal wire.

Preferably, the prognostic circuit of EM also includes a current comparison module, a voltage comparison module and an output module;

the current comparison module is configured to be connected with the output port of the current monitoring module and output a current warning signal to the output module when the compared result of the output of the current monitoring module and the reference unit of the current comparison module is over the monitoring condition of the current monitoring module;

the voltage comparison module is configured to be connected with the monitoring intersection of the resistance monitoring module and output a resistance warning signal to the output module when the compared result of the output of the monitoring intersection of the resistance monitoring module and the reference unit of the voltage comparison module is over the resistance comparison monitoring condition, where the intersection of the monitoring metal wire and the comparison metal wire is the monitoring intersection; and the output module is configured to an EM warning signal when a current warning signal and/or a resistance warning signal are received.

Preferably, the current comparison module includes a current reference source and a current comparator, the output port of the current monitoring module is connected with the first input port of the current comparator, the current reference source is connected with the second input port of the current comparator, the output current of the current reference source is less than that of the current output module, and the output port of the current comparison module is the output port of the current comparator;

the output of the output port of the current monitoring module is the output current of the output port of the current monitoring module, and the monitoring condition of the current monitoring module is that the output current of the output port of the current monitoring module is greater than or equal to that of the current reference source;

the resistance monitoring module includes a first voltage reference resistor and a second voltage reference resistor, the current output module is connected with the first port of the first voltage reference resistor, the second port of the first voltage reference resistor is connected in series with the second voltage reference resistor to form a reference series circuit, the reference series circuit is connected in parallel with the monitoring series circuit, and the resistance of the second voltage reference resistor is less than or equal to that of the first voltage reference resistor, and the intersection of the first voltage reference resistor and the second voltage reference resistor is a reference intersection;

the voltage comparison module includes a voltage comparator, the monitoring intersection of the resistance monitoring module is connected with the first input port of the voltage comparator, the reference intersection of the resistance monitoring module is connected with the second input port of the voltage comparator, and the output port of the voltage comparison module is the output port of the voltage comparator;

the output of the monitoring intersection of the resistance monitoring module is the output voltage of the monitoring intersection of the resistance monitoring module, and the resistance comparison monitoring condition is that the output voltage of the monitoring intersection of the resistance monitoring module is less than or equal to that of the reference intersection of the resistance monitoring module; and the output module includes an OR gate, the output port of the current comparison module is connected with the first input port of the OR gate, and the output port of the voltage comparison module is connected with the second input port of the OR gate.

Preferably, the current output module of the resistance monitoring module also includes a stress current source, a testing current source, a first stress switch module and a first testing switch module, the stress current source is connected with the first port of the monitoring metal wire by the first stress switch module, and the testing current source is connected with the first port of the monitoring metal wire by the first testing switch module;

the resistance monitoring module also includes a second stress switch module, and the second port of the monitoring metal wire is grounded by the second stress switch module;

the current comparison module also includes a second testing switch module, and the reference current source is connected with the second input port of the current comparator by the second testing switch module; and the output module also includes a third stress switch module, and the output port of the OR gate is grounded by the third stress switch module.

Preferably, the first stress switch module, the second stress switch module, the third stress switch module, the first testing switch module and the second testing switch module are switching circuits.

The above prognostic circuit of EM failure for IC is provided with a plurality of conductive metals configured to embrace the monitoring metal wire that when the current output module outputs current to the monitoring metal wire and a whisker is created by an EM in the monitoring metal wire, the whisker will form a short circuit with at least one conductive metal, and a short-circuit current that can be monitored by outsiders is formed, so as to implement to give a warning for a failure of short-circuit caused by EM to avoid unpredictable results from the short-circuit caused by a whisker created by EM.

Meanwhile, the prognostic circuit of EM failure for IC of the present disclosure can also be added a resistance warning. For the happening of the resistance increased by EM and the short circuit caused by whisker, the prognostic circuit of EM failure for IC of the present disclosure can monitor the short circuit caused by the increase in resistance or the whisker, so as to greatly increase the warning efficiency of the EM, and reduce the risk caused by MOS device failure during operation, guarantee plenty of time between failures and improve mission success when using a MOS device.

DETAILED DESCRIPTION OF THE PREFERRED EMBODIMENTS

The present disclosure may be best understood by reference to the following description of embodiments taken in conjunction with the accompanying drawings.

A prognostic circuit of EM failure for IC includes a current monitoring module, the current monitoring module includes a current output module electrically connected with a monitoring metal wire, and one or more conductive metals covered by an oxide layer of the IC and electrically insulated with the monitoring metal wire, the current output module includes at least one current source, the conductive metal is electrically connected with the output port of the current monitoring module, and the monitoring metal wire is surrounded by the conductive metal.

When the current output module outputs current to the monitoring metal wire and a whisker is caused by EM in the monitoring metal wire, a short circuit will be formed by the whisker with at least one conductive metal, and a short-circuit current that can be monitored and warned by outsides will be formed, so whether a short circuit caused by EM happens can be monitored by monitoring the output port.

In one embodiment of the present disclosure, the conductive metal includes a first metal provided on the top of the monitoring metal wire, a second metal provided on the bottom of the monitoring metal wire, and third metals respectively provided on the two sides of the monitoring metal wire, and the first metal, the second metal and the third metals are electrically interconnected by a plurality of through-hole metals passing through a oxide layer.

Actually after reading the present disclosure one skilled in the art can make modifications and variations to the above embodiment, for example, the monitoring metal wire is placed in a cylindrical conductive metal, the conductive metal is electrically insulated with the monitoring metal wire by an oxide layer, and the conductive metal is electrically connected with the output port by a lead, so a whisker growing in any direction can be short-circuited with the conductive metal.

However, the method of setting the metal wire according to the above embodiment brings a lower cost, and implements that the whisker can be short-circuited with at least one conductive metal in whichever direction the whisker grows at the same.

Figure 1:
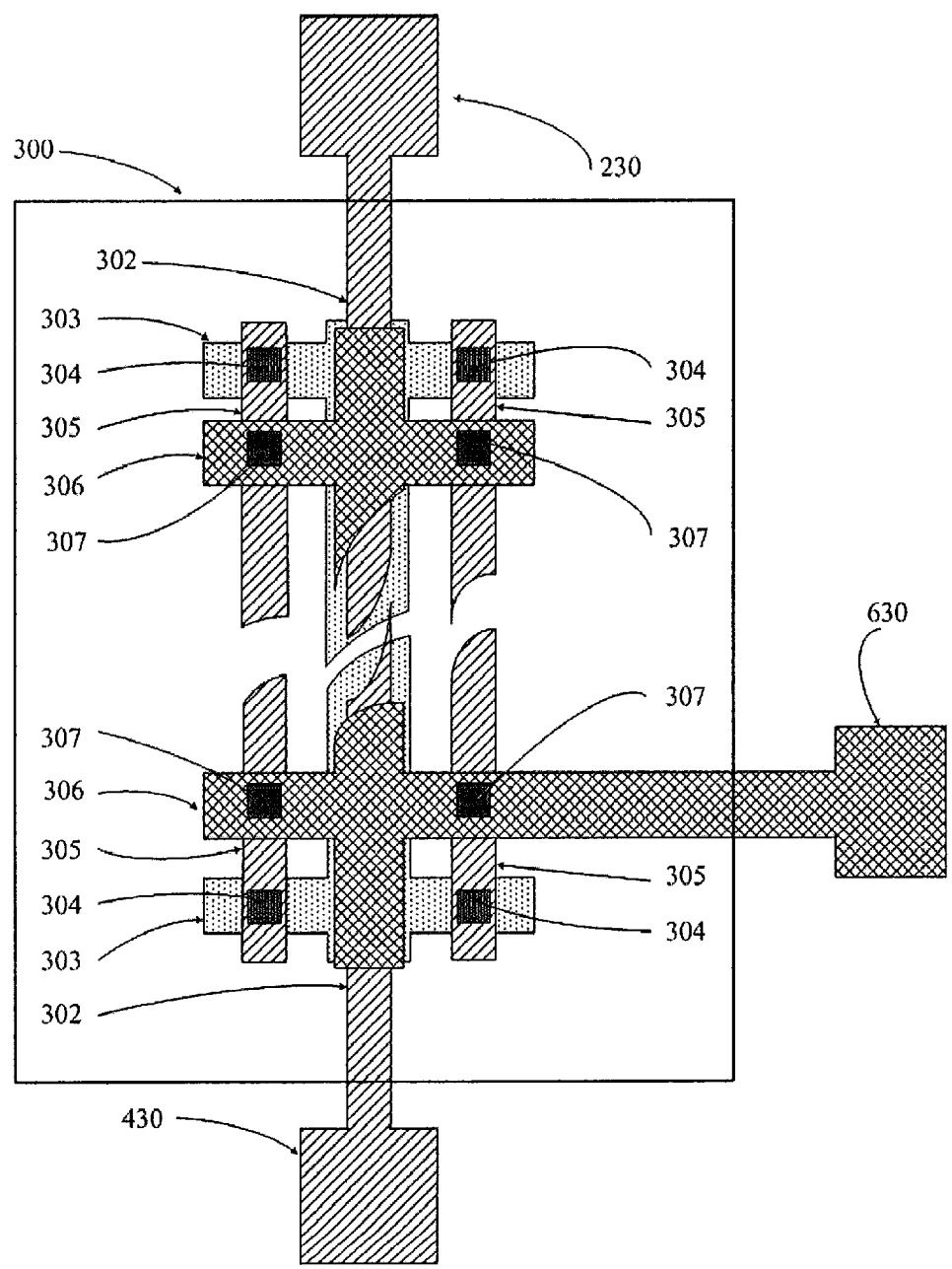
FIG. 1 is a top view illustrating a current monitoring module of a prognostic circuit of EM failure for IC according to one embodiment of the present disclosure.
Figure 2:
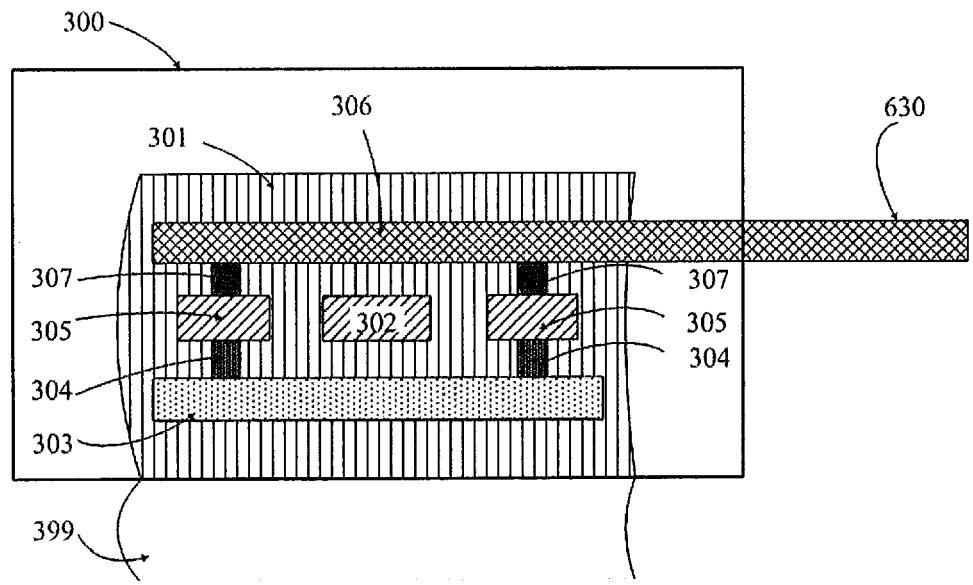
FIG. 2 is a front view illustrating a current monitoring module of a prognostic circuit of EM failure for IC according to one embodiment of the present disclosure.

FIG. 1 is a top view illustrating a current monitoring module of a prognostic circuit of EM failure for IC according to one embodiment of the present disclosure. FIG. 2 is a front view illustrating a current monitoring module of a prognostic circuit of EM failure for IC according to one embodiment of the present disclosure. As shown in FIGS. 1-2, the current monitoring module 300 is placed on the substrate 399 of the IC and configured to monitor the monitoring metal wire 302, and the current monitoring module 300 includes a second metal 303, a third metal 305, a first metal 306, a first through-hole metal 304, a second through-hole metal 307, and a current output module (not shown) electrically connected with the monitoring metal wire 302. The second metal 303 is directly below and parallel to the monitoring metal wire 302, and the second metal 303 is electrically insulated with the monitoring metal wire by an oxide layer 301 of the IC; the third metals 305 are located on the two sides of the monitoring metal wire 302, which are parallel to each other, and the third metals 305 are electrically insulated with the monitoring metal wire 302 by an oxide layer 301; the first metal 306 is directly above and parallel to the monitoring metal wire 302, and the first metal 304 is electrically insulated with the monitoring metal wire 302 by an oxide layer 301; the third metal 305 is electrically connected with the second metal 303 by the first through-hole metal 304 passing through an oxide layer 301; and the third metal 305 is electrically connected with the first metal 306 by the second through-hole metal 307 passing through an oxide layer 301, and the first metal 306 is electrically connected with the output port 630 of the current monitoring module.

The purpose of setting the current output module is to speed up the creation of an EM in the monitoring metal wire 302 that the EM in the monitoring metal wire 302 is created faster than that in other metal wires in the whole IC, so the prognostic circuit of EM failure for IC can give an early warning before there is an EM in other metal wires of the IC.

After reading the present disclosure one skilled in the art can make modifications and variations to the above embodiment, for example, the first metal is connected with the second metal by a through-hole metal, or the first metal is not kept to be parallel to the monitoring metal wire.

However, the method of setting the metal wire according to the above embodiment brings a lower cost, and the whisker grown in any part of the monitoring metal wire the can be short-circuited with at least one conductive metal in whichever direction the whisker grows by the first metal being parallel to the monitoring metal wire, the second metal being parallel to the monitoring metal wire and the third metal being parallel to the monitoring metal wire, so the short circuit can be monitored by the current monitoring module.

In one embodiment of the present disclosure, the prognostic circuit of EM failure for IC of the present disclosure also includes a resistance monitoring module connected with the monitoring metal wire, and the resistance monitoring module is configured to transfer the resistance variation of the monitoring metal wire to voltage variation and output.

For the happening of the resistance increased by EM and the short circuit caused by whisker, the prognostic circuit of EM failure for IC of the present disclosure can monitor the short circuit caused by the increase in resistance or the whisker, so as to greatly increase the warning efficiency of the EM failure.

Based on reading the present disclosure, one skilled in the art can design the specific circuit of the resistance monitoring module by limited testing.

In one embodiment of the present disclosure, the resistance monitoring module includes a comparison metal wire, the current output module is connected with a first end of the monitoring metal wire, and a second end of the monitoring metal wire is connected in series with the comparison metal wire to form a monitoring series circuit. The intersection of the monitoring metal wire and the comparison metal wire is the monitoring intersection.

Figure 3:
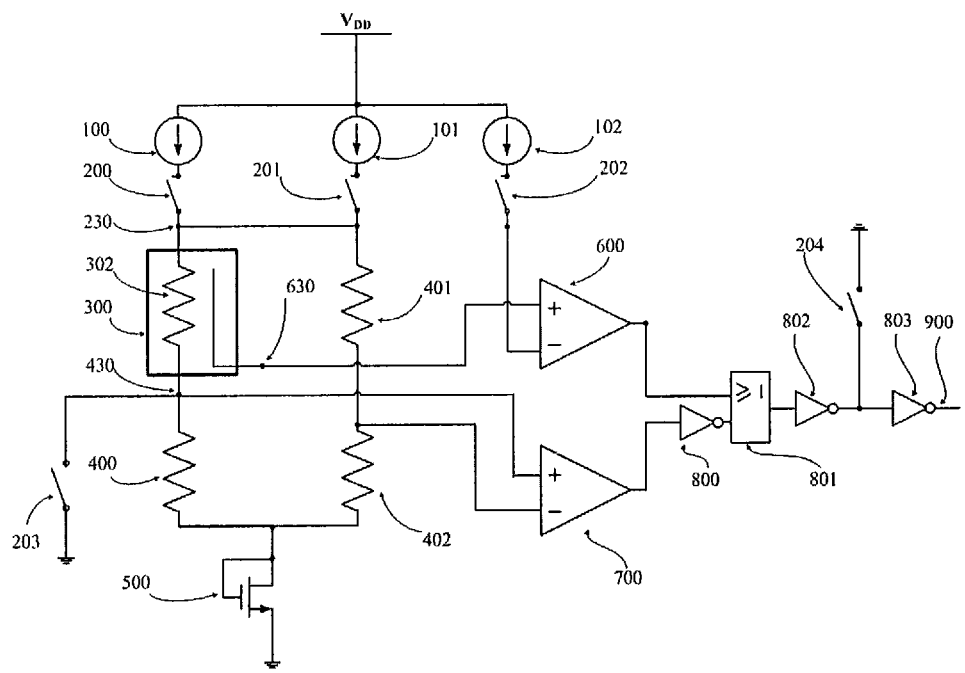
FIG. 3 is a circuit block diagram illustrating a prognostic circuit of EM failure for IC according to one embodiment of the present disclosure.

As shown in FIG. 3, the resistance monitoring module includes a comparison metal wire 400. In the embodiment, the current output module includes a testing current source 101. The testing current source 101 is connected with the first end 230 of the monitoring metal wire 302; the second end of the monitoring metal wire 302 is connected in series with the comparison metal wire 400 to form a monitoring series circuit; and the intersection 430 of the monitoring metal wire 302 and the comparison metal wire 400 is the monitoring intersection.

The resistance variation of the monitoring metal wire 302 can be obtained by monitoring the voltage of the monitoring intersection 430. Under normal conditions, the voltage of the monitoring intersection 430 does not change, but when the resistance of the monitoring metal wire 302 becomes larger, the voltage of the monitoring intersection 430 will drop. The voltage reduction of the monitoring intersection 430 can reflect an increase in resistance of the monitoring metal wire 302 caused by EM, so as to realize the warning in the monitoring metal wire 302.

In one embodiment of the present disclosure, the resistance of the comparison metal wire 400 is the same as that of the monitoring metal wire 302, and it can be realized by using a comparison metal wire 400 with the same length, width and material as the monitoring metal wire 302.

In the embodiment, because the resistance of the comparison metal wire 400 is the same as that of the monitoring metal wire 302 and the voltage of the monitoring intersection 430 is about half of that of the whole monitoring series circuit, once the voltage of the monitoring intersection 430 is less than half of that of the whole monitoring series circuit, a warning can be given, resulting in convenient monitor.

However, after reading the present disclosure one skilled in the art can make modifications and variations to the above embodiment, for example, the resistance of the comparison metal wire 400 is proportional, instead of the same, to that of the monitoring metal wire 302. Through a specific proportion, the voltage of the monitoring intersection 430 without an EM can be calculated, so when the voltage of the monitoring intersection 430 is less than the calculated value, a warning signal is given.

In one embodiment of the present disclosure, the prognostic circuit of EM failure for IC of the present disclosure also includes a current comparison module, a voltage comparison module and an output module.

The current comparison module is configured to be connected with the output port of the current monitoring module and output a current warning signal to the output module when the compared result of the output of the current monitoring module and the reference unit of the current comparison module is over the monitoring condition of the current monitoring module.

The voltage comparison module is configured to be connected with the monitoring intersection of the resistance monitoring module and output a resistance warning signal to the output module when the compared result of the output of the monitoring intersection of the resistance monitoring module and the reference unit of the voltage comparison module is over the resistance comparison monitoring condition.

The output module is configured to an EM warning signal when a current warning signal and/or a resistance warning signal are received.

The above warning signals output from the current monitoring module and the resistance monitoring module can be manage uniformly by adding the current comparison module, the voltage comparison module and the output module that a unified warning signal can be given whenever an EM in the monitoring metal wire is monitored by the current monitoring module or the resistance monitoring module.

Based on reading the present disclosure, one skilled in the art can design the specific circuit by limited testing.

In one embodiment of the present disclosure, as shown in FIG. 3, the current comparison module includes a current reference source 102 and a current comparator 600. The output port 630 of the current monitoring module is connected with the positive input port of the current comparator 600, the current reference source 102 is connected with the negative input port of the current comparator 600, the output current of the current reference source 102 is less than that of the current output module, and the output port of the current comparison module is the output port of the current comparator 600. Preferably, the current reference source 102 is a high-precision current source used as a current reference.

The output of the output port 630 of the current monitoring module is the output current of the output port 630 of the current monitoring module, and the monitoring condition of the current monitoring module is that the output current of the output port 630 of the current monitoring module is greater than or equal to that of the current reference source.

Preferably, the monitoring condition of the current monitoring module is that the output current of the output port 630 of the current monitoring module is greater than that of the current reference source.

In the embodiment, when the current of the positive input port of the current comparator 600 is larger than that of the negative input port of the current comparator 600, the output port of the current comparator 600 becomes "1" from "0", so the current warning signal is that the output port of the current comparator 600 becomes "1" from "0".

Actually the output port 630 can be connected with the negative input port of the current comparator 600, and the current reference source can be connected with the positive input port of the current comparator 600, so the current warning signal is that the output port of the current comparator 600 becomes "0" from "1".

Figure 6:
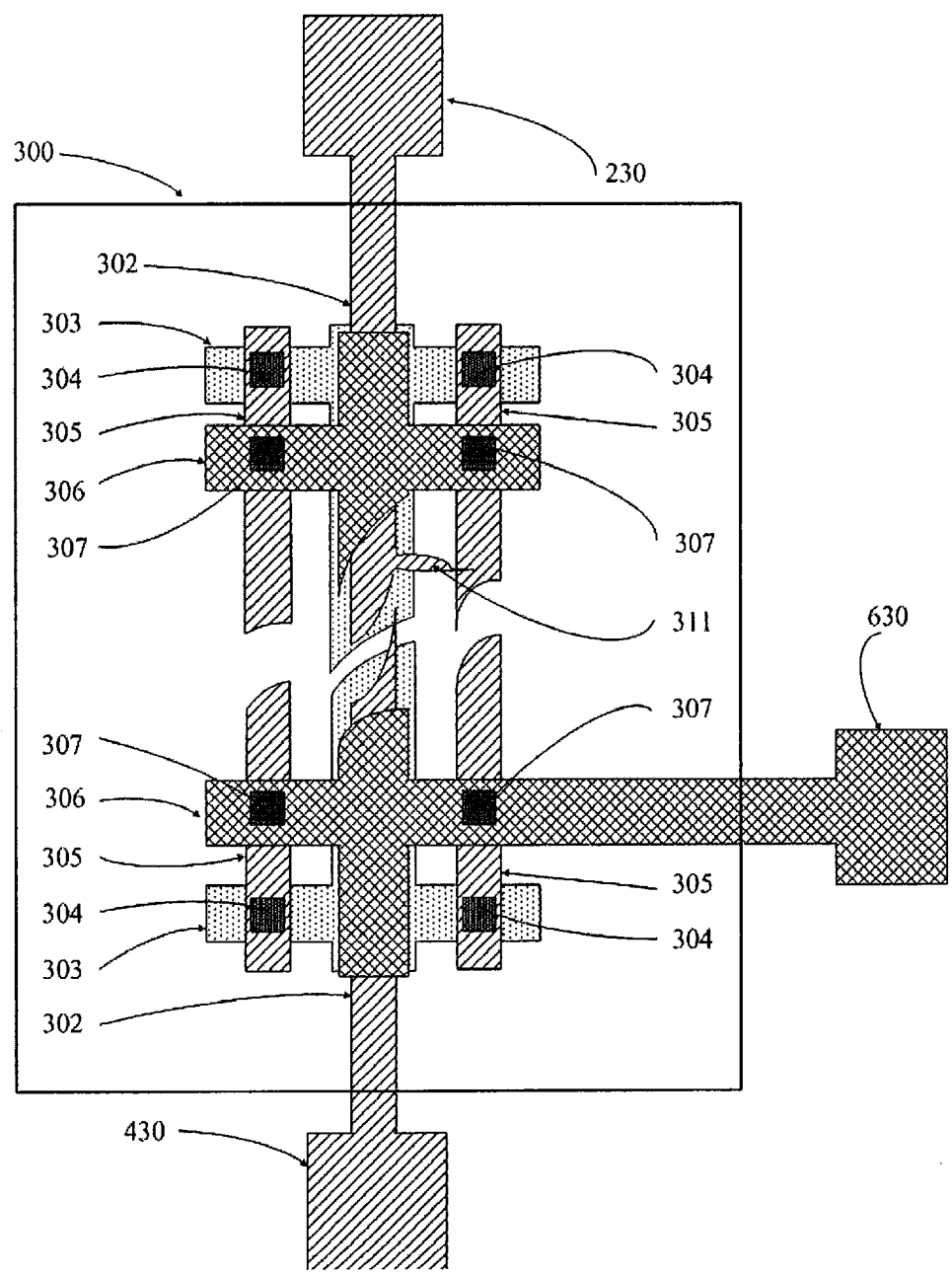
FIG. 6 is a top view illustrating a hillock in a monitoring metal wire of a prognostic circuit of EM failure for IC short-circuited with a metal on the right according to one embodiment of the present disclosure.
Figure 7:
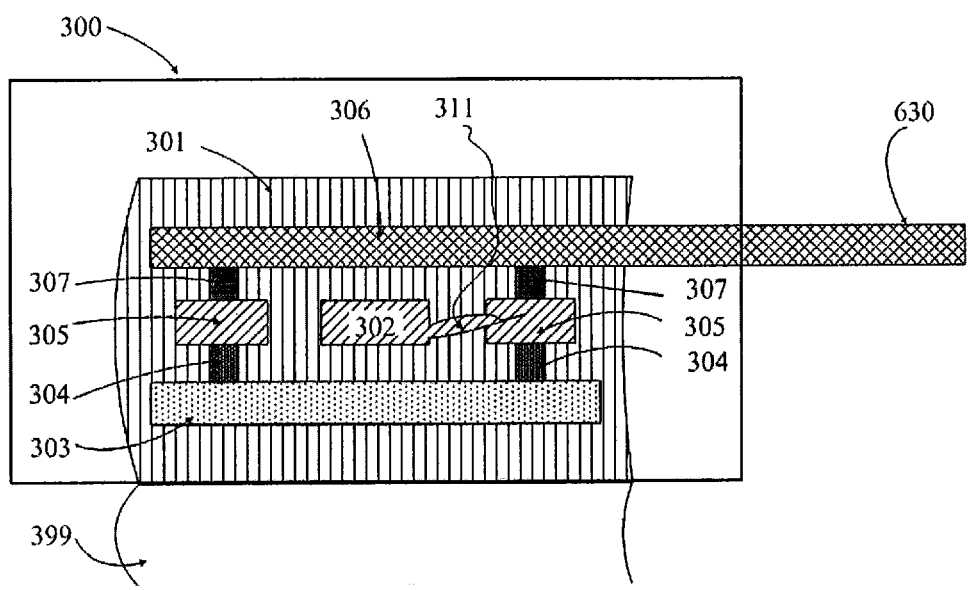
FIG. 7 is a front view illustrating a hillock in a monitoring metal wire of a prognostic circuit of EM failure for IC short-circuited with a metal on the right according to one embodiment of the present disclosure.
Figure 8:
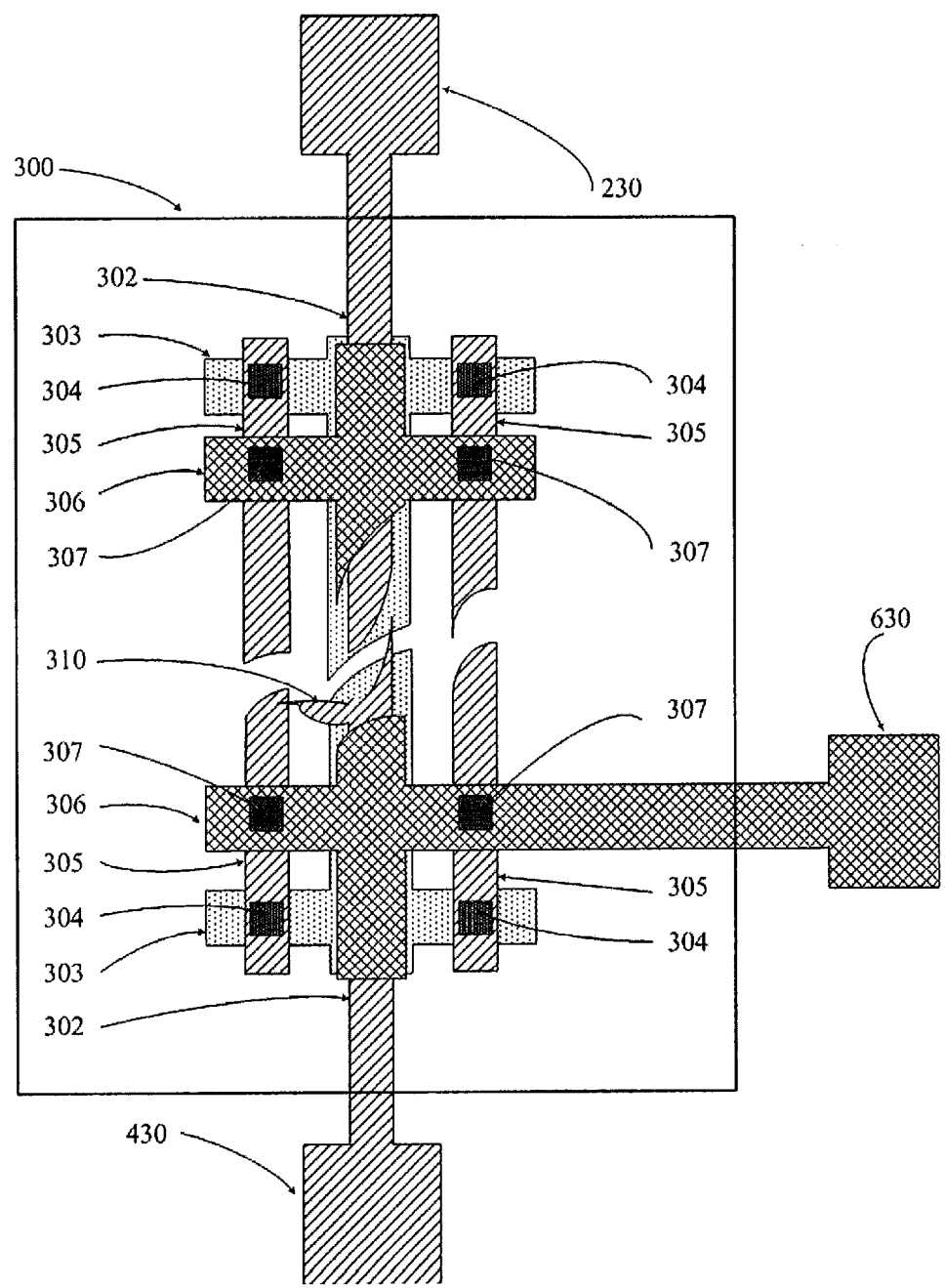
FIG. 8 is a top view illustrating a hillock in a monitoring metal wire of a prognostic circuit of EM failure for IC short-circuited with a third metal according to one embodiment of the present disclosure.
Figure 9:
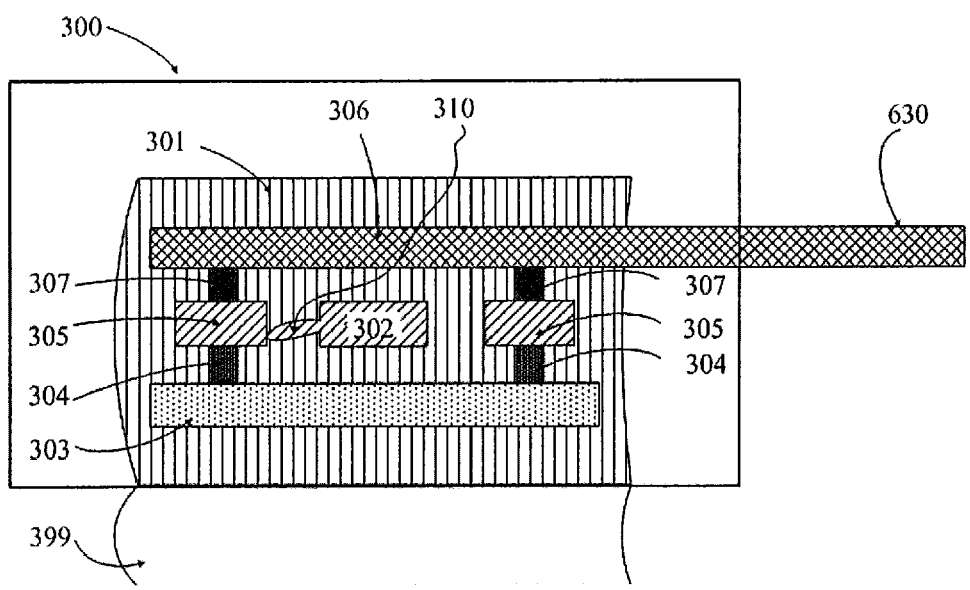
FIG. 9 is a front view illustrating a hillock in a monitoring metal wire of a prognostic circuit of EM failure for IC short-circuited with a third metal according to one embodiment of the present disclosure.
Figure 10:
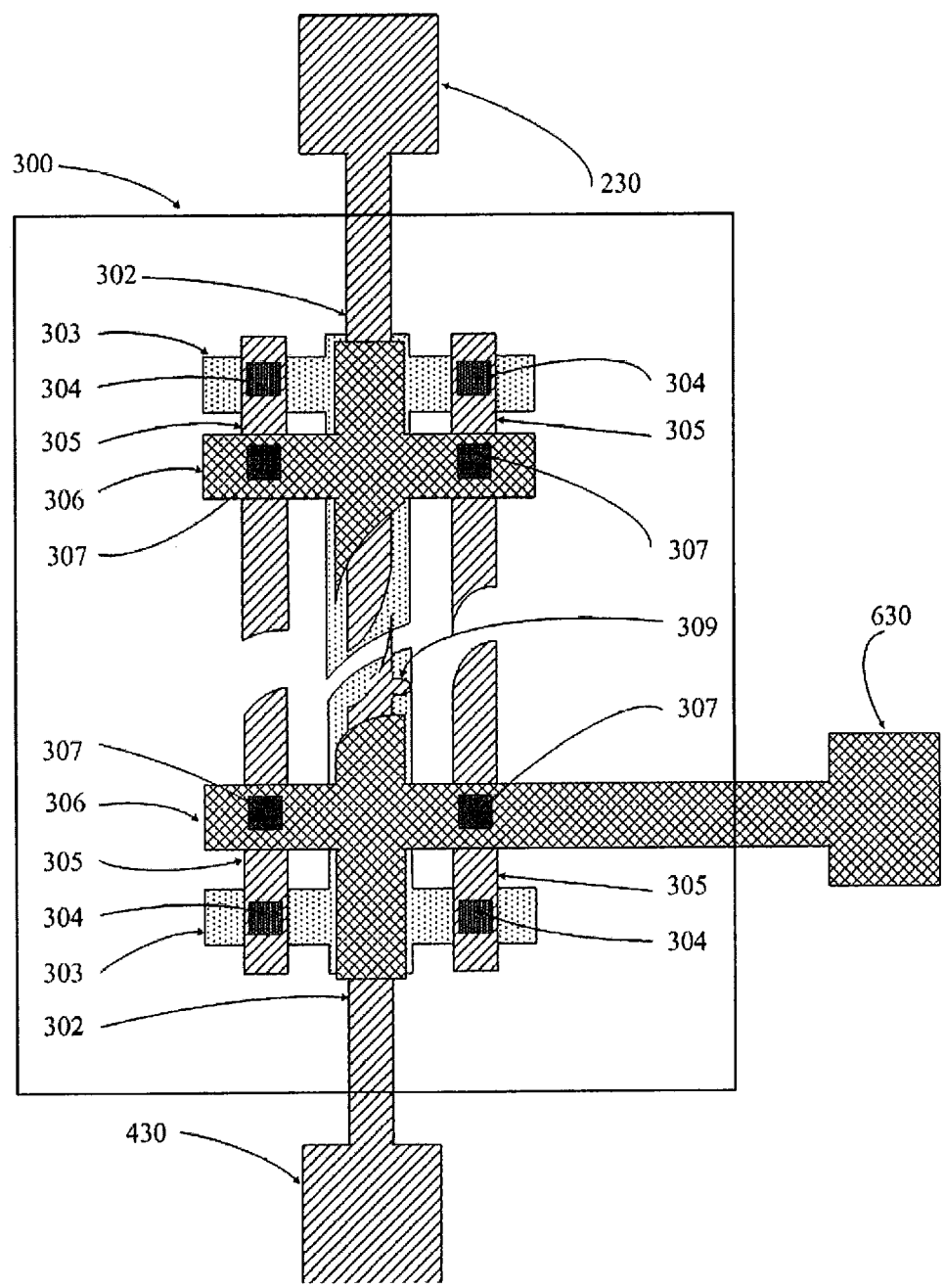
FIG. 10 is a top view illustrating a hillock in a monitoring metal wire of a prognostic circuit of EM failure for IC short-circuited with a second metal according to one embodiment of the present disclosure.
Figure 11:
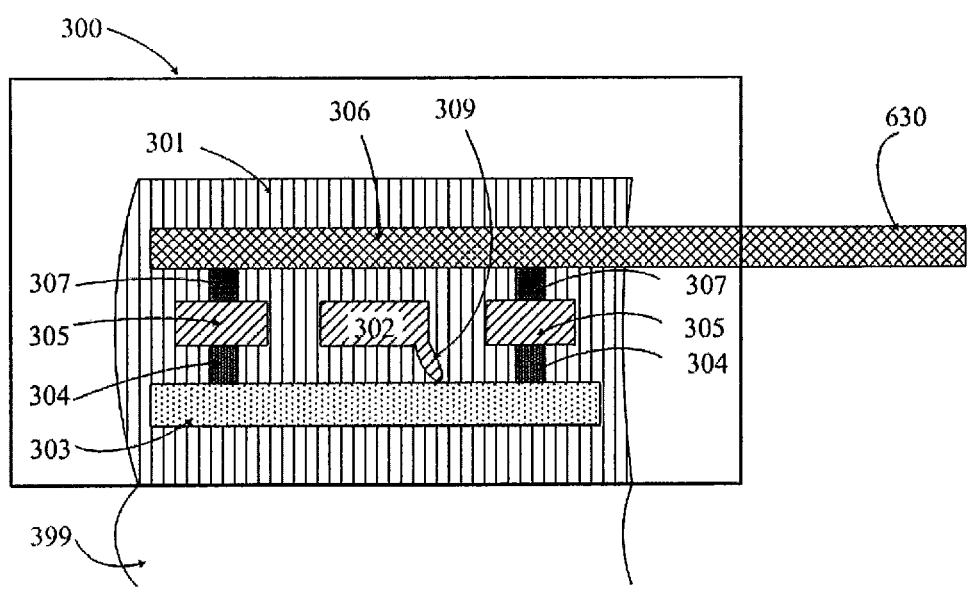
FIG. 11 is a front view illustrating a hillock in a monitoring metal wire of a prognostic circuit of EM failure for IC short-circuited with a second metal according to one embodiment of the present disclosure.
Figure 12:
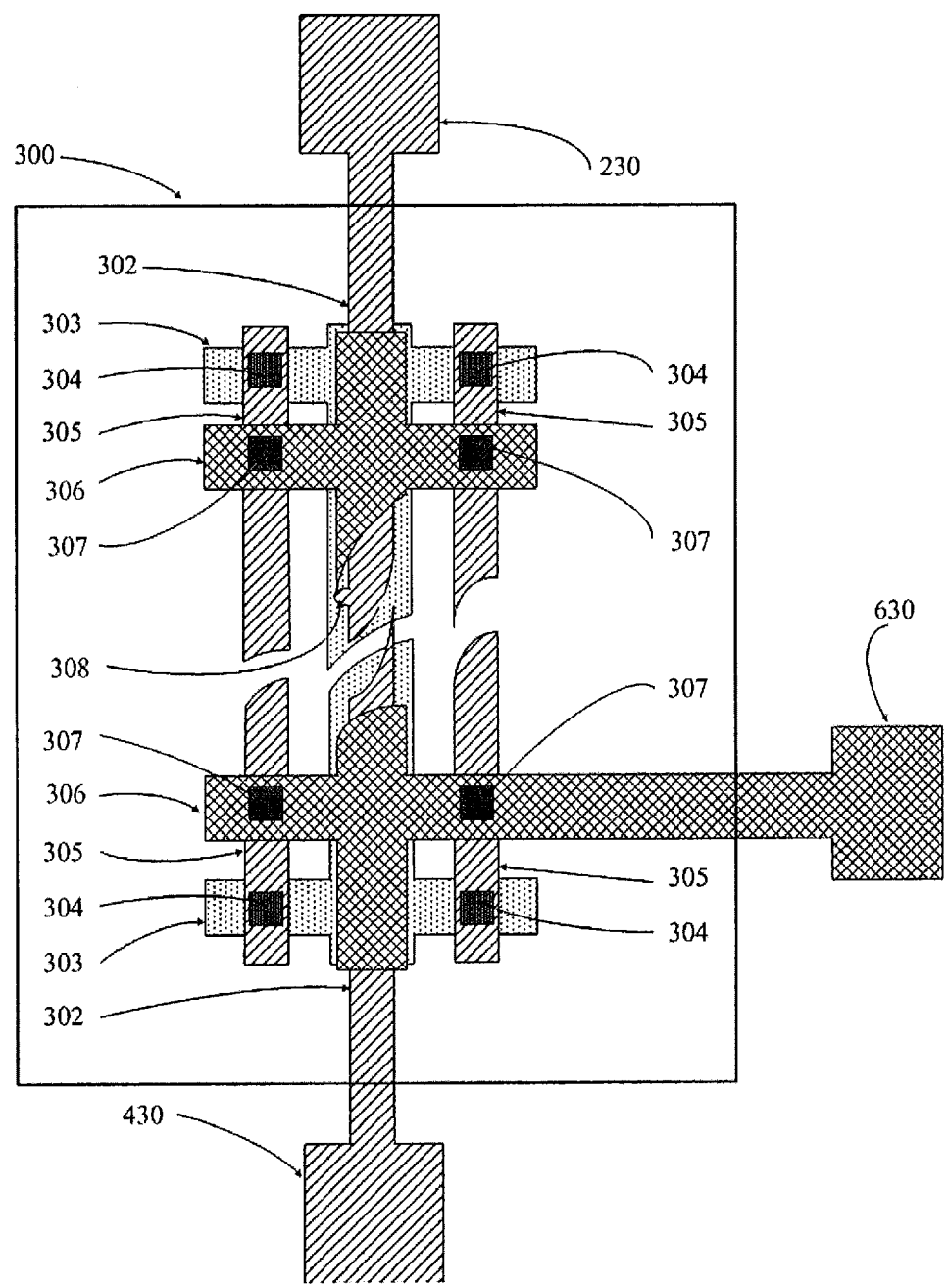
FIG. 12 is a top view illustrating a hillock in a monitoring metal wire of a prognostic circuit of EM failure for IC short-circuited with a first metal according to one embodiment of the present disclosure.
Figure 13:
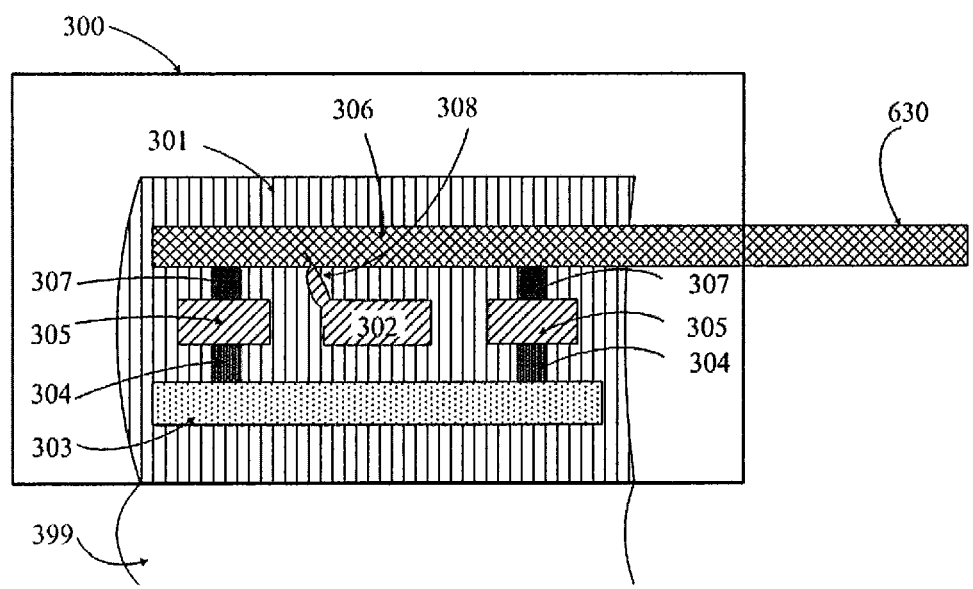
FIG. 13 is a front view illustrating a hillock in a monitoring metal wire of a prognostic circuit of EM failure for IC short-circuited with a first metal according to one embodiment of the present disclosure.

Preferably, the current reference source 102 is a high-precision current source used as a current reference. The current from the current reference source 102 flows into the negative input port of the current comparator 600 as a reference threshold current that a threshold of the short-circuit current caused by a hillock. When there is not a whisker in the monitoring metal wire grown due to an EM, the output port 630 of the current monitoring module can not output current, so the current of the negative input port of the current comparator 600 is larger than that of the positive input port, and the output port of the current comparator 600 output "0". The current monitoring module 300 monitors the hillock grown in the monitoring metal wire 302 in real time. The hillock is formed by the whisker grown by an EM. When the hillock grows to a certain extent, there will be four possible ways for short-circuit: a. the hillock 311 passing through an oxide layer 301 and short-circuited with a metal 304 on the right, as shown in FIGS. 6-7; b. the hillock 311 passing through an oxide layer 301 and short-circuited with a third metal 305, as shown in FIGS. 8-9; c. the hillock 311 passing through an oxide layer 301 and short-circuited with a second metal 303, as shown in FIGS. 10-11; and d. the hillock 311 passing through an oxide layer 301 and short-circuited with a first metal 306, as shown in FIGS. 12-13. When any of these situations occur, there will be current flows into the positive input port of the current comparator 600 through the output port 630. The output current of the current reference source 102 is less than that of the current output module (such as the test current source 101), so the current of the output port 630 is larger than the output current of the current reference source 102, and the current of the positive input port of the current comparator 600 is larger than that of the negative input port, at the same time, the output port of the current comparator 600 outputs "1" to form a current warning signal.

The resistance monitoring module includes a first voltage reference resistor 401 and a second voltage reference resistor 402. The testing current source 101 is connected with the first port of the first voltage reference resistor 401, and the second port of the first voltage reference resistor 401 is connected in series with the second voltage reference resistor 402, to form a reference series circuit. The reference series circuit is connected in parallel with the monitoring series circuit. The resistance of the second voltage reference resistor 402 is less than or equal to that of the first voltage reference resistor 401. The intersection of the first voltage reference resistor 401 and the second voltage reference resistor 402 is a reference intersection.

Preferably, the ratio of the resistance of the second voltage reference resistor 402 to the resistance of the first voltage reference resistor 401 is 1:1.2.

The voltage comparison module includes a voltage comparator 700, the monitoring intersection 430 of the resistance monitoring module is connected with the positive input port of the voltage comparator 700, the reference intersection of the resistance monitoring module is connected with the negative input port of the voltage comparator 700, and the output port of the voltage comparison module is the output port of the voltage comparator 700.

The output of the monitoring intersection 430 of the resistance monitoring module is the output voltage of the monitoring intersection of the resistance monitoring module, and the resistance comparison monitoring condition is that the output voltage of the monitoring intersection 430 of the resistance monitoring module is less than or equal to that of the reference intersection of the resistance monitoring module.

Preferably, the resistance comparison monitoring condition is that the output voltage of the monitoring intersection 430 of the resistance monitoring module is less than that of the reference intersection of the resistance monitoring module.

In the embodiment, when the voltage of the positive input port of the voltage comparator 700 is less than that of the negative input port of the voltage comparator 700, the output port of the voltage comparator 700 becomes "0" from "1". The resistance warning signal is that the output port of the voltage comparator 700 becomes "0" from "1".

Actually the monitoring intersection 430 can be connected with the negative input port of the voltage comparator 700, and the reference intersection can be connected with the positive input port of the voltage comparator 700, so the resistance warning signal is that the output port of the voltage comparator 700 becomes "1" from "0".

Take the ratio of the resistance of the second voltage reference resistor 402 to the resistance of the first voltage reference resistor 401 being 1:1.2 for example, when there is no increase in resistance of the monitoring metal wire 302 caused by EM, the voltage of the monitoring intersection 430 is larger than that of the reference intersection, and the output port of the voltage comparator 700 is "1". When there is an increase in resistance of the monitoring metal wire 302 caused by EM, the voltage of the monitoring intersection 430 will drop, and when the voltage of the monitoring intersection 430 drops to be less than the voltage of the reference intersection, the output port of the voltage comparator 700 becomes "0" from "1" to form a resistance warning signal.

The output module includes an OR gate 801, the output port of the current comparison module that the output port of the current comparator 600 is connected with the first input port of the OR gate, and the output port of the voltage comparison module that the output port of the voltage comparator 700 is connected with the second input port of the OR gate 801 by a inverter 800.

The output port of the OR gate 801 is at a high level "1" when any input port of the OR gate 801 receives a high level "1". The outputs of the current comparator 600 and the voltage comparator 700 are shaped by the output module to output standard digital signals, and the EM warning signal is a high level "1" that is output from the output port 900 of the output module.

Actually the output module also can includes a inverter 802 and a inverter 803 connected with the output port of the OR gate 801 in turn, the EM warning signal is a high level "1", and the output of the OR gate 801 is shaped by the inverter 802 and the inverter 803.

Preferably, the first voltage reference resistor 401 and the second voltage reference resistor 402 can be polysilicon resistors. Because the resistance of the polysilicon resistor is considerably larger than that of the monitoring metal wire 302 and comparison metal wire 400, the output current of the current output module almost passes the monitoring metal wire 302 to create an EM in the monitoring metal wire 302.

After reading the present one skilled in the art can make modifications and variations to the above embodiment, for example, the current comparison module can use a voltage source as a reference voltage and a voltage comparator, the output current of the current monitoring module can be converted to an output voltage by a simple circuit design and input to the voltage comparator, and whether an EM occurs can be learned by comparison with the reference voltage. The monitoring condition of the current monitoring module and the monitoring condition of the resistance monitoring module also can be modified according to the actual circuit design, for example, when the current comparison module uses a voltage source and a voltage comparator, the monitoring condition of the current monitoring module can be modified as giving a warning when the reference voltage is exceeded. The monitoring condition of the resistance monitoring module also can be provided with a certain threshold, and when the output voltage of the monitoring intersection of the resistance monitoring module is less than the certain threshold of the reference intersection of the resistance monitoring module, a resistance warning signal will be output.

In one embodiment of the present disclosure, the current output module of the resistance monitoring module also includes a stress current source 100, a testing current source 101, a first stress switch module 200 and a first testing switch module 201, the stress current source 100 is connected with the first port of the monitoring metal wire 302 by the first stress switch module 200, and the testing current source 101 is connected with the first port of the monitoring metal wire 302 by the first testing switch module 201.

The resistance monitoring module also includes a second stress switch module 203, and the second port of the monitoring metal wire 302 is grounded by the second stress switch module 203.

The current comparison module also includes a second testing switch module 202, the reference current source is connected with the second input port of the current comparator 600 by the second testing switch module 202, the input port of the current comparator 600 is connected with the first input port of the OR gate 801.

The output module also includes a third stress switch module 204, and the output port of the OR gate is grounded by the third stress switch module.

Figure 4:
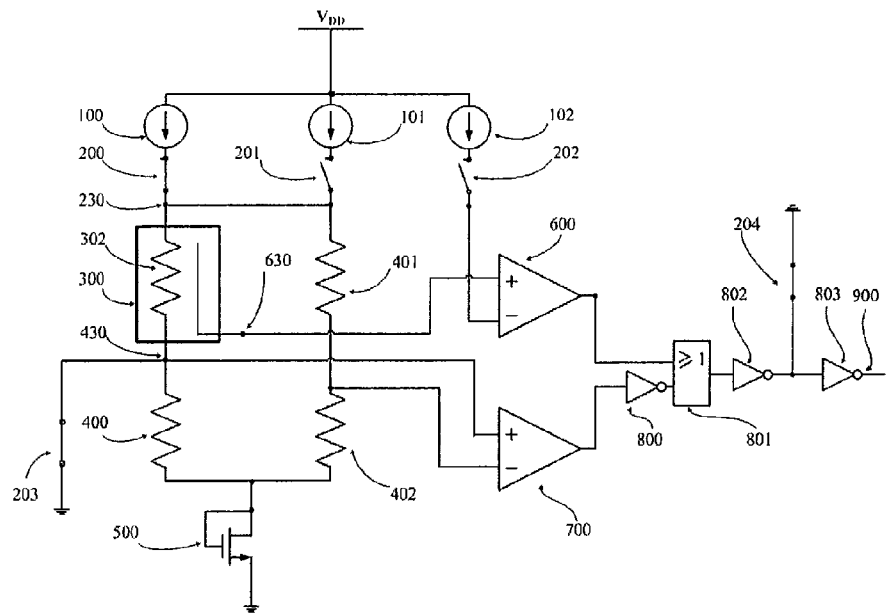
FIG. 4 is a circuit block diagram illustrating a prognostic circuit of EM failure for IC according to one embodiment of the present disclosure.

In the embodiment, with the action of the first stress switch module 200, the first testing switch module 201, the second testing switch module 202, the second stress switch module 203 and the third stress switch module 204 there are two states: stress state and testing state. As shown in FIG. 4, when the first testing switch module 201 and the second testing switch module 202 are open, and the first stress switch module 200, the second stress switch module 203 and the third stress switch module 204 are close, the circuit is in the stress state. At this point, the stress current from the stress current source 100 flows through the monitoring metal wire 302 by the first stress switch module 200 and to earth by the second stress switch module 203. Because the resistance of the first voltage reference resistor 401 and the second voltage reference resistor 402 is considerably larger than that of the monitoring metal wire 302, the stress current can be considered flowing through the monitoring metal wire 302 completely. In the state, large current flows through the monitoring metal wire 302 that causes an EM in the monitoring metal wire 302, and the resistance will be changed slowly or a hillock will be grown that leads to a short circuit. At this point, the final output is at high level.

Figure 5:
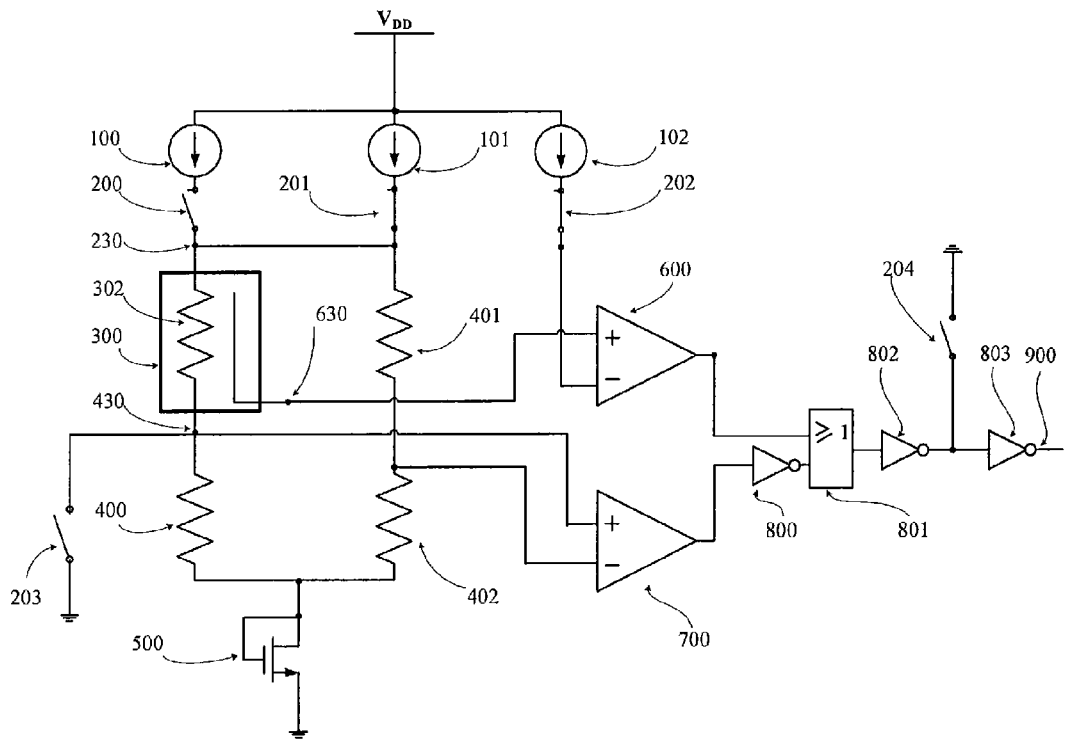
FIG. 5 is a circuit block diagram illustrating a prognostic circuit of EM failure for IC under testing according to one embodiment of the present disclosure.

As shown in FIG. 5, when the first testing switch module 201 and the second testing switch module 202 are close, and the first stress switch module 200, the second stress switch module 203 and the third stress switch module 204 are open, the circuit is in the testing state. On the one hand, the current from the testing current source 101 flows through a network that consist of the monitoring metal wire 302, the comparison metal wire 400, the first voltage reference resistor 401 and the second voltage reference resistor 402. Because the resistance of the first voltage reference resistor 401 and the second voltage reference resistor 402 is considerably larger than that of the monitoring metal wire 302, the current can be considered almost flowing through the monitoring metal wire 302 and the comparison metal wire 400 completely. The intersection of the comparison metal wire 400 and the second voltage reference resistor 402 can be grounded directly. However, preferably, it also includes a NMOS 500 connected as a diode, the drain terminal of the NMOS 500 connected as a diode is connected with the intersection of the comparison metal wire 400 and the second voltage reference resistor 402, and the source terminal of the NMOS 500 connected as a diode is grounded. Due to the NMOS 500 connected as a diode, the common mode voltages of the intersection of the monitoring metal wire 302 and the comparison metal wire 400 and the intersection of the first voltage reference resistor 401 and the second voltage reference resistor 402 are VDD/2, within the input common mode voltage range of the following voltage comparator.

On the other hand, the current from the current reference source 102 flows into the negative input port of the current comparator 600 as a reference threshold current. When there is no whisker caused by EM in the monitoring metal wire 302, the output port 630 of the current monitoring module 300 can not output a current. So the current of the negative input port of the current comparator 600 is larger than that of the positive input port. The output of the output port of the current comparator 600 is "0". The current monitoring module 300 monitors the hillock grown in the monitoring metal wire 302 in real time. The hillock is formed by the whisker grown by an EM. When the hillock grows to a certain extent, there will be four possible ways for short-circuit: a. the hillock 311 passing through an oxide layer 301 and short-circuited with a metal 304 on the right, as shown in FIGS. 6-7; b. the hillock 311 passing through an oxide layer 301 and short-circuited with a third metal 305, as shown in FIGS. 8-9; c. the hillock 311 passing through an oxide layer 301 and short-circuited with a second metal 303, as shown in FIGS. 10-11; and d. the hillock 311 passing through an oxide layer 301 and short-circuited with a first metal 306, as shown in FIGS. 12-13. When any of these situations occur, there will be current flows into the positive input port of the current comparator 600 through the output port 630.

The above first stress switch module, second stress switch module, third stress switch module, first testing switch module and second testing switch module can be switchgears directly. The circuit in stress state or testing state can be implemented by controlling on-off of the switchgears.

In one embodiment of the present disclosure, the first stress switch module 200, the second stress switch module 203, the third stress switch module 204, the first testing switch module 201 and the second testing switch module 202 are switching circuits. The switching circuits are used to change the EM warning signal to be output finally by different input waves input.

Figure 14:
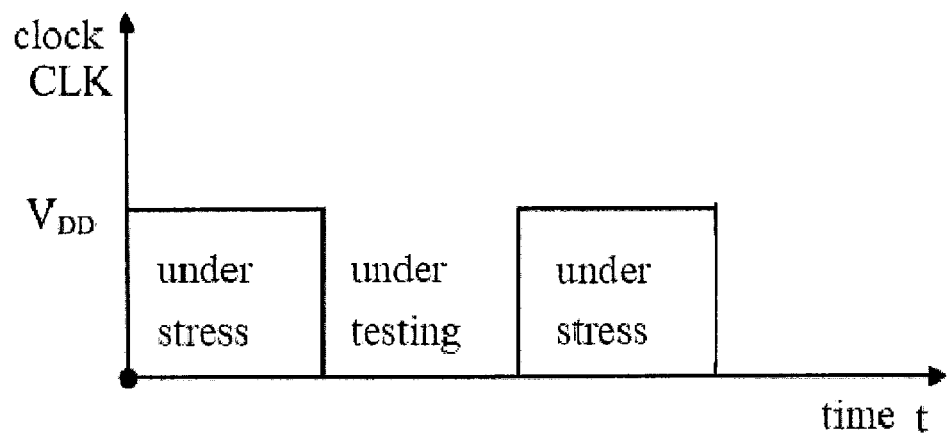
FIG. 14 is a view of status switching signal waveform of a prognostic circuit of EM failure for IC according to one embodiment of the present disclosure.

For example, the output module uses a OR gate 801, a inverter 802 connected with the output port of the OR gate 801, and the ratio of the resistance of the second voltage reference resistor 402 to the resistance of the first voltage reference resistor 401 is 1:1.2. The circuit is as shown in FIG. 3. As shown in FIG. 14, it is a view of status switching signal waveform of an EM warning circuit for IC according to one embodiment of the present disclosure. The circuit is in stress state when the output is high, and the circuit is in testing state when the output is low. The input clock of the first stress switch module 200, the second stress switch module 203 and the third stress switch module 204 is consistent with the status switching signal waveform in FIG. 14, and the input clock of the first testing switch module 201 and the second testing switch module 202 is inverse with the status switching signal waveform in FIG. 14.

Figure 15:
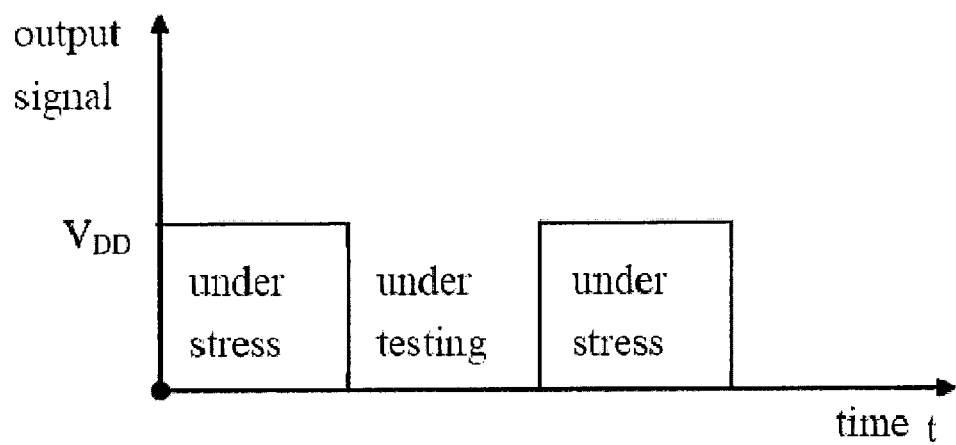
FIG. 15 is a view illustrating how an EM warning signal output from an output port of an output module varies with time when detecting the increase in resistance of a metal wire caused by EM is less than 20 percent and the short-circuit current caused by a hillock is less than a threshold according to one embodiment of the present disclosure.

FIG. 15 is a view illustrating how an EM warning signal output from an output port of an output module varies with time when detecting the increase in resistance of a metal wire caused by EM is less than 20 percent and the short-circuit current caused by a hillock is less than a threshold according to one embodiment of the present disclosure. The waveform of the output port of the output module is consistent with the status switching signal waveform.

Figure 16:
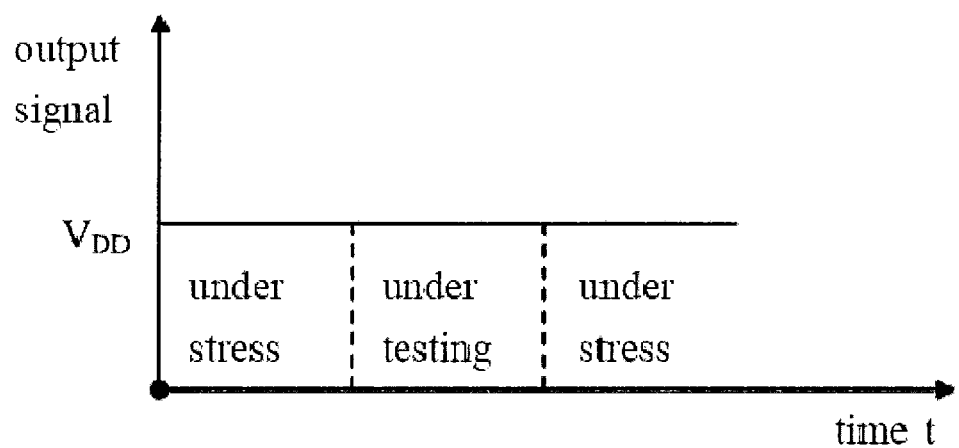
FIG. 16 is a view illustrating how an EM warning signal output from an output port of an output module varies with time when detecting the increase in resistance of a metal wire caused by EM is more than 20 percent or the short-circuit current caused by a hillock is more than a threshold according to one embodiment of the present disclosure.

FIG. 16 is a view illustrating how an EM warning signal output from an output port of an output module varies with time when detecting the increase in resistance of a metal wire caused by EM is more than 20 percent or the short-circuit current caused by a hillock is more than a threshold according to one embodiment of the present disclosure. Therefore, the EM warning signal is at a high level "1". When continuously receiving high levels "1" in the testing state, an EM is thought to occur in the monitoring metal wire 302, and the EM will occur in other metal wires of the IC, so actions need to be taken immediately.

The above embodiments described are only several embodiments of the present disclosure, and they should not be understood as a limitation on the scope of the present disclosure. It should be noted that the modifications and variations could be made by the skilled in the art, which will be within the protection scope of the present disclosure. The protection scope of this disclosure is defined by the appending claims.

What is claimed is:

1. A prognostic circuit of electromigration (EM) failure for integrated circuit (IC), comprising a current monitoring module, wherein the current monitoring module comprises a current output module electrically connected with a monitoring metal wire, and one or more conductive metals covered by an oxide layer of the integrated circuit and electrically insulated with the monitoring metal wire, the current output module includes at least one current source, the one or more conductive metals are electrically connected with the output port of the current monitoring module, the monitoring metal wire is surrounded by the one or more conductive metals and the one or more conductive metals comprises a first metal provided on top of the monitoring metal wire, a second metal provided on the bottom of the monitoring metal wire and a third metal respectively provided on the two sides of the monitoring metal wire, and the first metal, the second metal and the third metal are electrically interconnected by a plurality of through-hole metals passing through the oxide layer.

2. The prognostic circuit of EM failure for IC according to claim 1, wherein the second metal is directly below and parallel to the monitoring metal wire, and the second metal is electrically insulated with the monitoring metal wire by the oxide layer; the third metal is located on the two sides of the monitoring metal wire, which are parallel to each other, and the third metal is electrically insulated with the monitoring metal wire by the oxide layer; the first metal is directly above and parallel to the monitoring metal wire, and the first metal is electrically insulated with the monitoring metal wire by the oxide layer; and the plurality of through-hole metals include a first through-hole metal and a second through-hole metal, the third metal is electrically connected with the second metal by the first through-hole metal, and the third metal is electrically connected with the first metal by the second through-hole metal.

3. The prognostic circuit of EM failure for IC according to claim 1, wherein the prognostic circuit of EM failure also comprises a resistance monitoring module connected with the monitoring metal wire, and the resistance monitoring module is configured to transfer the resistance variation of the monitoring metal wire to a voltage variation and an output.

4. The prognostic circuit of EM failure for IC according to claim 3, wherein the resistance monitoring module comprises a comparison metal wire, the current output module is connected with a first end of the monitoring metal wire, and a second end of the monitoring metal wire is in series with the comparison metal wire to form a monitoring series circuit.

5. The prognostic circuit of EM failure for IC according to claim 4, wherein the resistance of the comparison metal wire is the same as that of the monitoring metal wire.

6. The prognostic circuit of EM failure for IC according to claim 4, wherein the prognostic circuit of EM failure also comprises a current comparison module, a voltage comparison module and an output module;
the current comparison module is configured to be connected with the output port of the current monitoring module and output a current warning signal to the output module when the compared result of the output of the current monitoring module and the reference unit of the current comparison module is over the monitoring condition of the current monitoring module;
the voltage comparison module is configured to be connected with the monitoring intersection of the resistance monitoring module and output a resistance warning signal to the output module when the compared result of the output of the monitoring intersection of the resistance monitoring module and the reference unit of the voltage comparison module is over the resistance comparison monitoring condition, where the intersection of the monitoring metal wire and the comparison metal wire is the monitoring intersection; and
the output module is configured to an EM warning signal when the current warning signal and/or the resistance warning signal are received.

7. The prognostic circuit of EM failure for IC according to claim 6, wherein the current comparison module comprises a current reference source and a current comparator, the output port of the current monitoring module is connected with the first input port of the current comparator, the current reference source is connected with the second input port of the current comparator, the output current of the current reference source is less than that of the current output module, and the output port of the current comparison module is the output port of the current comparator;
the output of the output port of the current monitoring module is the output current of the output port of the current monitoring module, and the monitoring condition of the current monitoring module is that the output current of the output port of the current monitoring module is greater than or equal to that of the current reference source;
the resistance monitoring module also comprises a first voltage reference resistor and a second voltage reference resistor, the current output module is connected with the first port of the first voltage reference resistor, the second port of the first voltage reference resistor is connected in series with the second voltage reference resistor to form a reference series circuit, the reference series circuit is connected in parallel with the monitoring series circuit, the resistance of the second voltage reference resistor is less than or equal to that of the first voltage reference resistor, and the intersection of the first voltage reference resistor and the second voltage reference resistor is a reference intersection;
the voltage comparison module comprises a voltage comparator, the monitoring intersection of the resistance monitoring module is connected with the first input port of the voltage comparator, the reference intersection of the resistance monitoring module is connected with the second input port of the voltage comparator, and the output port of the voltage comparison module is the output port of the voltage comparator;
the output of the monitoring intersection of the resistance monitoring module is the output voltage of the monitoring intersection of the resistance monitoring module, and the resistance comparison monitoring condition is that the output voltage of the monitoring intersection of the resistance monitoring module is less than or equal to that of the reference intersection of the resistance monitoring module; and
the output module comprises an OR gate, the output port of the current comparison module is connected with the first input port of the OR gate, and the output port of the voltage comparison module is connected with the second input port of the OR gate.

8. The prognostic circuit of EM failure for IC according to claim 7, wherein the current output module of the resistance monitoring module also comprises a stress current source, a testing current source, a first stress switch module and a first testing switch module, the stress current source is connected with the first port of the monitoring metal wire by the first stress switch module, and the testing current source is connected with the first port of the monitoring metal wire by the first testing switch module;

the resistance monitoring module also comprises a second stress switch module, and the second port of the monitoring metal wire is grounded by the second stress switch module;

the current comparison module also comprises a second testing switch module, and the reference current source is connected with the second input port of the current comparator by the second testing switch module; and the output module also comprises a third stress switch module, and the output port of the OR gate is grounded by the third stress switch module.

9. The prognostic circuit of EM failure for IC according to claim 8, wherein the first stress switch module, the second stress switch module, the third stress switch module, the first testing switch module and the second testing switch module are switching circuits.

\* \* \* \* \*